(12) United States Patent
Juengling et al.

(10) Patent No.: US 6,890,858 B2
(45) Date of Patent: *May 10, 2005

(54) METHODS OF FORMING MATERIALS OVER UNEVEN SURFACE TOPOLOGIES, AND METHODS OF FORMING INSULATIVE MATERIALS OVER AND BETWEEN CONDUCTIVE LINES

(75) Inventors: Werner Juengling, Boise, ID (US); Kevin G. Donohoe, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/277,386

(22) Filed: Oct. 21, 2002

(65) Prior Publication Data

US 2003/0040186 A1 Feb. 27, 2003

Related U.S. Application Data

(63) Continuation of application No. 09/876,641, filed on Jun. 6, 2001, now Pat. No. 6,479,388, which is a continuation of application No. 09/274,551, filed on Mar. 23, 1999, now Pat. No. 6,271,141.

(51) Int. Cl.$^7$ ............................................. H01L 21/311
(52) U.S. Cl. ...................... 438/695; 438/710; 438/691; 438/693; 438/694
(58) Field of Search .............................. 438/695, 700, 438/710, 691, 693, 694

(56) References Cited

U.S. PATENT DOCUMENTS 4,352,724 A 10/1982 Sugishima et al.
4,630,357 A 12/1986 Rogers et al.

(Continued)

OTHER PUBLICATIONS

S. Wolf et al.: "Etching Silicon and Silicon Dioxide In Fluorocarbon–Containing Plasmas"; vol. 1, Silicon Processing for the VLSI Era, 1986; pp. 547–554.
Wolf, "Silicon Processing for the VLSI Era", vol. 2: Process Integration, Lattice Press, Sunset Beach, CA, USA, pp. 51–57, 176–246, 1990.

*Primary Examiner*—Nadine G. Norton
*Assistant Examiner*—Matthew Anderson
(74) *Attorney, Agent, or Firm*—Wells St. John P.S.

(57) ABSTRACT

In one aspect, the invention encompasses a semiconductor processing method of forming a material over an uneven surface topology. A substrate having an uneven surface topology is provided. The uneven surface topology comprises a valley between a pair of outwardly projecting features. A layer of material is formed over the uneven surface topology. The layer comprises outwardly projecting portions over the outwardly projecting features of the surface topology and has a gap over the valley. The layer is etched, and the etching forms protective material within the gap while removing an outermost surface of the layer. The etching substantially does not remove the material from the bottom of the gap. In another aspect, the invention encompasses a semiconductor processing method of forming a material over metal-comprising lines. A first insulative material substrate is provided. A pair of spaced metal-comprising lines are formed over the substrate. The spaced metal-comprising lines define an uneven surface topology which comprises the lines and a valley between the lines. A layer of second insulative material is formed over the uneven surface topology. The layer comprises outwardly projecting portions over the lines and having a gap over the valley. The layer of second insulative material is subjected to an etch which forms a protective material at the bottom of the gap. The protective material substantially prevents the second insulative material from being etched from the bottom of the gap.

29 Claims, 12 Drawing Sheets

U.S. PATENT DOCUMENTS

| | | |
|---|---|---|
| 5,366,590 A | 11/1994 | Kadomura |
| 5,458,919 A | 10/1995 | Okano et al. |
| 5,468,342 A | 11/1995 | Nulty et al. |
| 5,549,786 A | 8/1996 | Jones et al. |
| 5,679,606 A | 10/1997 | Wang et al. |
| 5,759,906 A | 6/1998 | Lou |
| 5,783,100 A | 7/1998 | Blalock et al. |
| 5,798,016 A | 8/1998 | Oehrlein et al. |
| 5,814,564 A | 9/1998 | Yao et al. |
| 5,871,658 A | 2/1999 | Tao et al. |
| 5,872,061 A | 2/1999 | Lee et al. |
| 5,880,037 A | 3/1999 | Arleo |
| 5,962,344 A | 10/1999 | Tu et al. |
| 5,965,463 A | 10/1999 | Cui et al. |
| 5,972,235 A | 10/1999 | Brigham et al. |
| 6,008,103 A | 12/1999 | Hoepfner |
| 6,025,255 A | 2/2000 | Chen et al. |
| 6,043,152 A | 3/2000 | Chang et al. |
| 6,106,678 A | 8/2000 | Shufflebotham et al. |
| 6,211,065 B1 | 4/2001 | Xi et al. |
| 6,271,141 B2 * | 8/2001 | Juengling et al. ........... 438/695 |
| 6,376,911 B1 | 4/2002 | Ryan et al. |
| 6,479,388 B2 * | 11/2002 | Juengling et al. ........... 438/695 |

\* cited by examiner

METHODS OF FORMING MATERIALS OVER UNEVEN SURFACE TOPOLOGIES, AND METHODS OF FORMING INSULATIVE MATERIALS OVER AND BETWEEN CONDUCTIVE LINES

CROSS REFERENCE TO RELATED APPLICATION

This application is a Continuation of U.S. patent application Ser. No. 09/876,641 which was filed on Jun. 6, 2001, now U.S. Pat. No. 6,479,388 B2, issued Nov. 12, 2002, which resulted from a continuation application of U.S. patent application Ser. No. 09/274,551, filed on Mar. 23, 1999 now U.S. Pat. No. 6,271,141 issued Aug. 7, 2001, entitled "Methods of Forming Materials Over Uneven Surface Topologies, and Methods of Forming Insulative Materials Over and Between Conductive Lines", naming Werner Juengling and Kevin G. Donohoe as inventors, the disclosures of which are incorporated by reference.

TECHNICAL FIELD

The invention pertains to methods of reducing non-planarity of surfaces, and, in particular applications, pertains to methods of forming materials over uneven surface topologies. In exemplary embodiments, the invention pertains to methods of forming insulative materials over and between conductive lines.

BACKGROUND OF THE INVENTION

Figure 1:
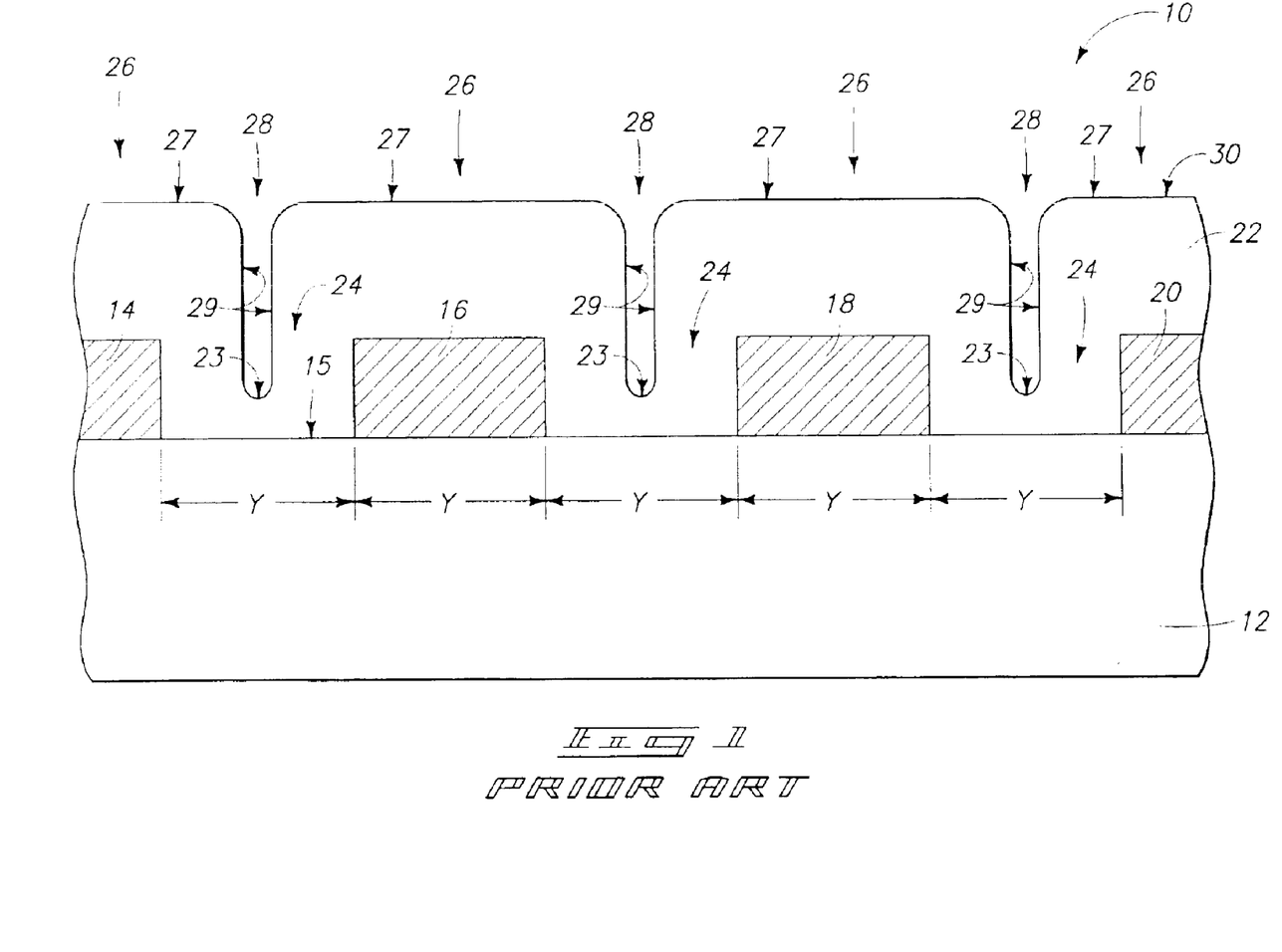
FIG. 1 is a diagrammatic, fragmentary, cross-sectional view of a substrate at a preliminary step of a prior art processing method.

A prior art method of forming insulative material over and between conductive lines is described with reference to FIGS. 1–4. Referring to FIG. 1, a fragment 10 is illustrated at a preliminary processing step. Fragment 10 comprises a substrate 12 having an upper surface 15. Conductive lines 14, 16, 18 and 20 are formed over upper surface 15. Substrate 12 can comprise an insulative material such as, for example, borophosphosilicate glass (BPSG), silicon dioxide and/or silicon nitride. Substrate 12 can further include a portion of a semiconductive material wafer. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Conductive lines 14, 16, 18 and 20 can comprise conductively doped polysilicon and/or metals. Exemplary metals are aluminum, aluminum alloys, copper, copper alloys, tungsten and titanium. In particular aspects, conductive lines 14, 16, 18 and 20 can consist essentially of metals (either in alloy form or elemental form). Such metallic conductive lines can further correspond to a first elevational level of metallic conductive lines formed over a semiconductive substrate (a so-called "metal 1" layer).

An insulative material 22 is formed over and between conductive lines 14, 16, 18 and 20. Material 22 can comprise, for example, silicon dioxide, and can be formed by chemical vapor deposition (CVD) utilizing a tetraorthosilicate (TEOS) precursor. Such CVD can occur at or below 400° C., which can be advantageous to avoid melting of any metals incorporated into lines 14, 16, 18 and 20.

In the construction of FIG. 1, material 22 is formed over an uneven surface topology. Such uneven surface topology comprises outward projecting features consisting of lines 14, 16, 18 and 20, and valleys 24 consisting of spaces between lines 14, 16, 18 and 20. The deposited material 22 comprises outwardly projecting features 26 over conductive lines 14, 16, 18 and 20, and comprises gaps 28 over valleys 24. The gaps 28 have bottoms 23 extending elevationally beneath uppermost surfaces of conductive lines 14, 16, 18, and 20. Material 22 thus comprises a substantially non-planar outer surface 30 which extends over lines 14, 16, 18 and 20, and within gaps 28. Outer surface 30 comprises substantially horizontal upper surfaces 27 and substantially vertical sidewall surfaces 29.

It is noted that a continuing goal of semiconductor fabrication is to decrease the size of circuit elements. Lines 14, 16, 18 and 20 have respective widths "Y" (shown for lines 16 and 18), and gaps 24 have about the same respective widths "Y". The width "Y" will typically correspond to about a minimum feature width achievable during fabrication of lines 14, 16, 18 and 20.

Present semiconductor fabrication processes achieve constructions in which "Y" is about 0.5 micron and, of course, a goal of future processes is to achieve constructions in which "Y" is less than 0.5 micron. The 0.5 micron spacing corresponding to gaps 24 is too tight to allow material 22 to form conformally over and between lines 14, 16, 18 and 20. If material 22 formed conformally over and between lines 14, 16, 18 and 20, gaps 28 would be relatively wide shallow gaps. Instead, gaps 28 have a high aspect ratio (i.e., an aspect ratio of at least about 3), which complicates further processing. Specifically, it is frequently desired to planarize material 22 to form material 22 into a substantially level base which can be utilized to support additional circuitry formed above it. A common method of planarization is chemical-mechanical polishing. However, such will not work effectively on the material 22 shown in FIG. 1 because the chemical-mechanical processing will be stopped before removing the material of lines 14, 16, 18 and 20, and hence before reaching the bottoms 23 of gaps 28. Accordingly, portions of gaps 28 will remain after a chemical-mechanical polishing process, and will cause a remaining portion of material 22 to have a non-planar outer surface.

Figure 3:
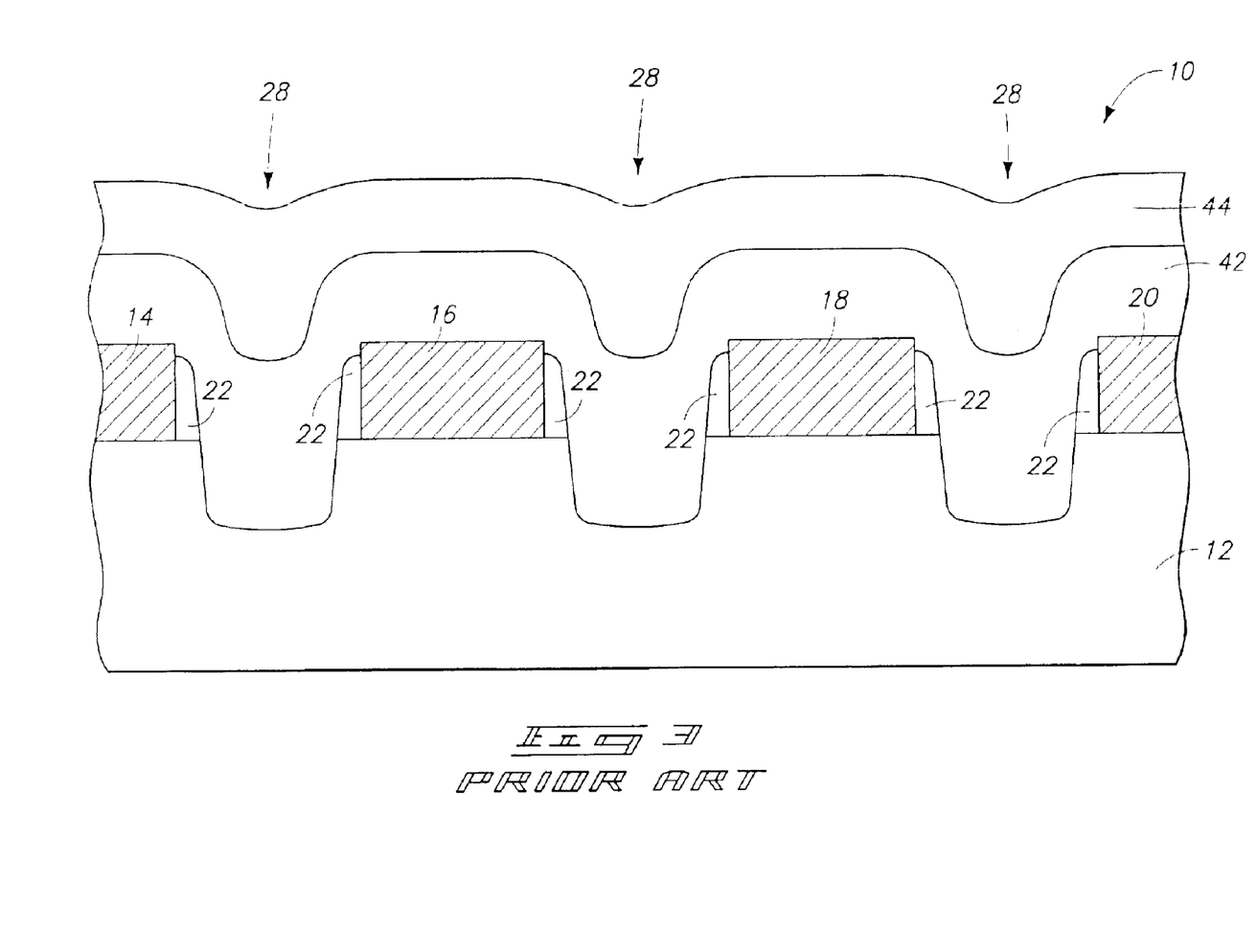
FIG. 3 is a view of the FIG. 1 substrate at a prior art processing step subsequent to that of FIG. 2.
Figure 4:
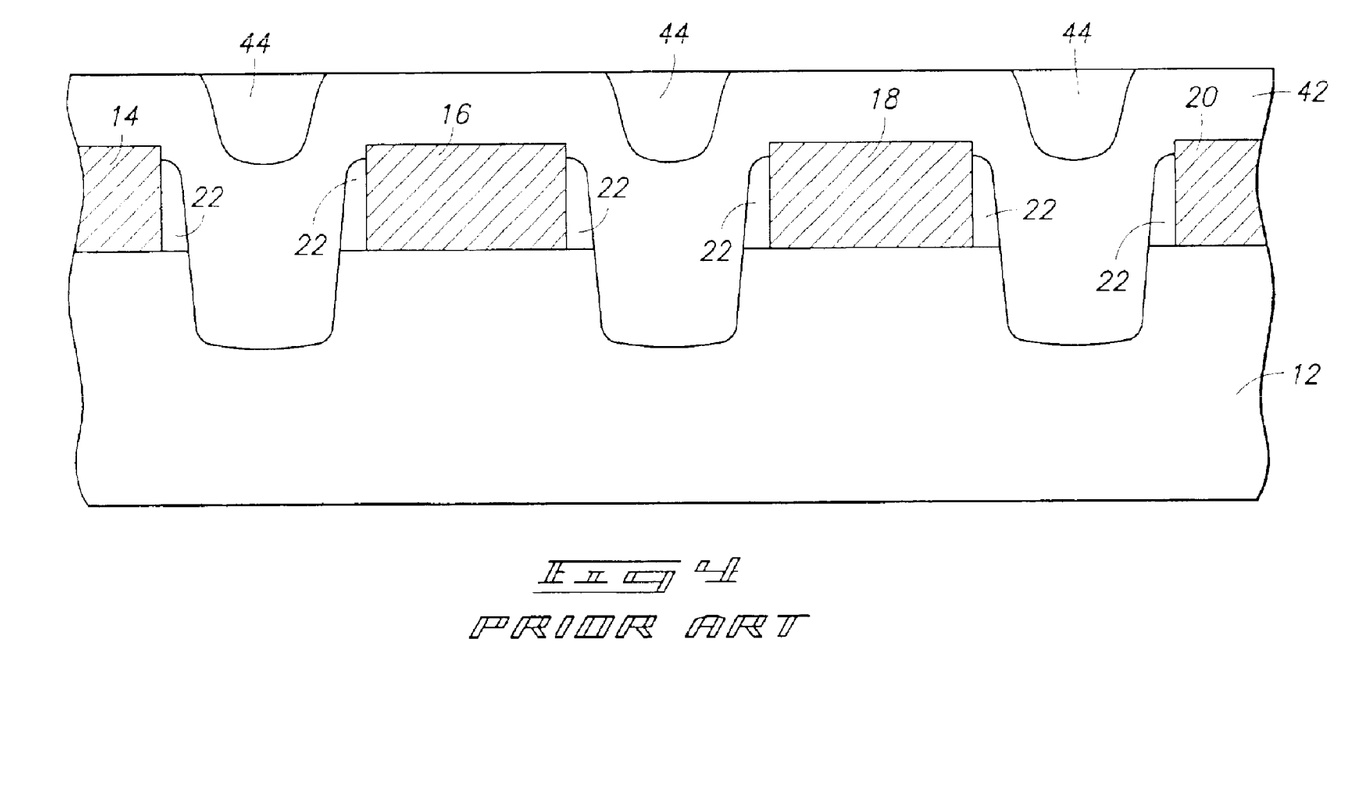
FIG. 4 is a view of the FIG. 1 substrate at a prior art processing step subsequent to that of FIG. 3.

In an effort to overcome the above-described difficulties in planarizing material 22, the processing of FIGS. 2–4 is employed. FIG. 2 illustrates fragment 10 after material 22 has been subjected to an anisotropic etch. Such etch forms material 22 into sidewall spacers 40 extending along sidewalls of conductive lines 14, 16, 18 and 20. The etching also widens gaps 28. Additionally, the etching can, as shown, extend gaps 28 into underlying material 12. The extent to which gaps 28 penetrate into material 12 depends on how selective the anisotropic etch is for material 22 relative to the material of substrate 12. If material 22 and substrate 12 comprise the same material (such as, for example, BPSG), then the etch will be non-selective for material 22 relative to the underlying material substrate 12.

Referring to FIG. 3, additional layers 42 and 44 are formed over conductive lines 14, 16, 18 and 20, and within gaps 28. Materials 42 and 44 comprise insulative materials such as, for example, silicon dioxide or BPSG. Materials 22 and 24 fill gaps 28 to a level above lines 14, 16, 18 and 20.

Referring to FIG. 4, materials 42 and 44 can be subjected to chemical-mechanical polishing to form a planarized insulative material having an upper surface above lines 14, 16, 18 and 20.

It would be desirable to develop alternative methods for forming a planarized material. More generally, it would be desirable to develop new methods of forming and planarizing materials formed over uneven surface topologies.

SUMMARY OF THE INVENTION

In one aspect, the invention encompasses a semiconductor processing method of forming a material over an uneven surface topology. A substrate having an uneven surface topology is provided. The uneven surface topology comprises a valley between a pair of outwardly projecting features. A layer of material is formed over the uneven surface topology. The layer comprises outwardly projecting portions over the outwardly projecting features of the surface topology and has a gap over the valley. The layer is etched. The etching forms protective material within the gap while removing an outermost surface of the layer. The etching substantially does not remove the material from the bottom of the gap.

In another aspect, the invention encompasses a semiconductor processing method of forming a material over metal-comprising lines. A first insulative material substrate is provided. A pair of spaced metal-comprising lines are formed over the substrate. The spaced metal-comprising lines define an uneven surface topology which comprises the lines and a valley between the lines. A layer of second insulative material is formed over the uneven surface topology. The layer comprises outwardly projecting portions over the lines and having a gap over the valley. The layer of second insulative material is subjected to an etch which forms a protective material at the bottom of the gap. The protective material substantially prevents the second insulative material from being etched from the bottom of the gap.

BRIEF DESCRIPTION OF THE DRAWINGS

Preferred embodiments of the invention are described below with reference to the following accompanying drawings.

FIG. 2 is a view of the FIG. 1 substrate at a prior art processing step subsequent to that of FIG. 1.

FIG. 7 is a view of the FIG. 5 substrate at a processing step subsequent to that of FIG. 6.

FIG. 9 is a diagrammatic, fragmentary, cross-sectional view of a substrate at a preliminary step of a second embodiment method of the present invention, with such step occurring after the prior art processing of FIG. 1.

FIG. 12 is a view of the FIG. 10 substrate at a processing step subsequent to that of FIG. 11.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The present invention encompasses methods for forming planar surfaces over materials having high aspect gaps (such as the material 22 of FIG. 1). As will become more clear from the discussion below, methods of the present invention become increasingly advantageous over prior art methods as aspect ratios of the gaps increase. Accordingly, while methods of the present invention can have applicability and advantages over the prior art for materials having gaps with aspect ratios of less than or equal to three, and can even have advantages for gaps with aspect ratios of less than or equal to one, the invention becomes particularly advantageous when aspect ratios are greater than or equal to five.

A first embodiment method of the present invention is described with reference to FIGS. 5–8. In referring to FIGS. 5–8, similar numbering to that utilized above in describing the prior art methods of FIGS. 1–4 will be used, with the suffix "a" included to differentiate the structures of FIGS. 5–8 from those of FIGS. 1–4.

Figure 5:
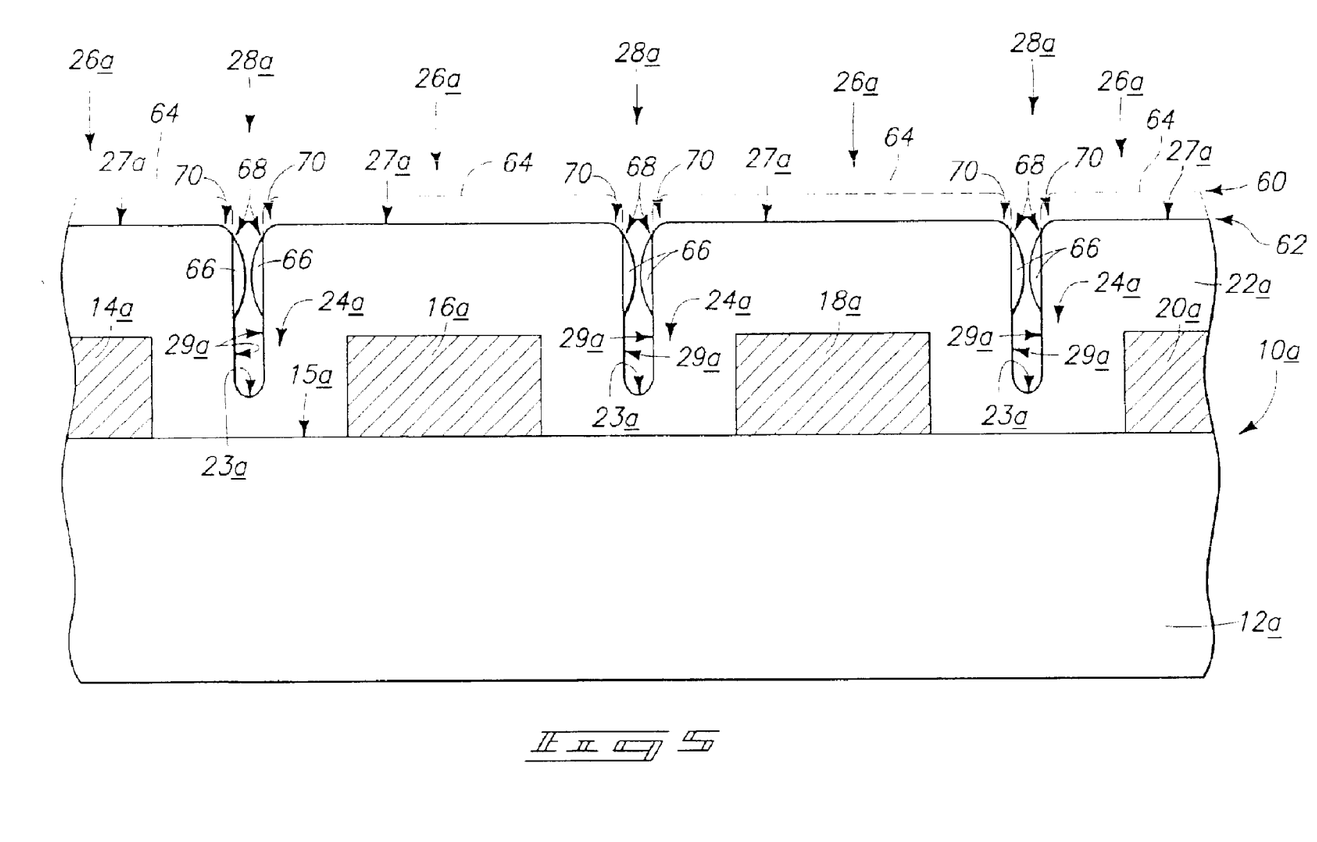
FIG. 5 is a diagrammatic, fragmentary, cross-sectional view of a substrate at a preliminary step of a first embodiment method of the present invention, with such step occurring after the prior art processing of FIG. 1.

Referring to FIG. 5, a fragment 10a is illustrated at a processing step subsequent to that of fragment 10 in FIG. 1. Fragment 10a comprises a substrate 12a having an upper surface 15a. Spaced conductive lines 14a, 16a, 18a and 20a are formed over surface 15a, and an insulative material 22a is deposited over and between conductive lines 14a, 16a, 18a and, 20a. Insulative material 22a can comprise, for example, doped or undoped silicon dioxide formed by CVD from TEOS.

Conductive lines 14a, 16a, 18a and 20a form an uneven surface topology over upper surface 15a. Specifically, lines 14a, 16a, 18a and 20a correspond to outwardly projecting features, with valleys 24a corresponding to spaces between the conductive lines. Material 22a is formed over the uneven surface topology and comprises outwardly extending projections 26a over the outwardly projecting features of lines 14a, 16a, 18a and 20a. Material 22a dips within valleys 24a to form gaps 28a over the valleys. Material 22a has been etched to reduce a height of material 22a from an initial height 60 (corresponding to a height of material 22 in FIG. 1) to a new height 62. A dashed line 64 in FIG. 5 is provided to show an outline corresponding to the original periphery of material 22a before the etching.

In accordance with the present invention, the etching of material 22a utilizes a high density plasma and an etching gas comprising at least one compound that includes both a halogen and carbon. For purposes of the present invention, a high density plasma is a plasma comprising at least about $1 \times 10^9$ charges/cm$^3$. Such high density plasma can be formed utilizing a so-called high density plasma reactor, which is a reactor that enables separate provision and control of a source power (for generating a plasma) and a bias power (for determining the velocity by which charged particles from the plasma impact a substrate within the reactor). An exemplary high density plasma reactor is an IPS etcher marketed by Applied Materials. Exemplary conditions for utilizing an Applied Materials IPS etcher in a method of the present invention are as follows. A source power is provided to be from about 800 watts to about 1,500 watts, with about 1,000 watts being preferred. A bias power is provided to be from about 500 watts to about 1,600 watts, with about 800 watts being preferred. A pressure within the reactor is provided to be from about 5 mTorr to about 100 mTorr, with about 20 mTorr being preferred. A roof temperature within the reactor is provided to be from about 100° C. to about 250° C., with about 140° C. being preferred. A ring temperature within the reactor is provided to be from about 150° C. to about 350° C., with about 200° C. being preferred. The etching gas comprises $C_2F_6$ provided at a flow of from about 20 standard cubic centimeters per minute (sccm) to about 100 sccm, with a flow of from about 20 sccm to about 60 sccm being preferred. In particular embodiments of the invention, the etching gas can consist essentially of $C_2F_6$.

As the exemplary conditions provided above indicate, the halogen of the etching gas can be fluorine. In general, suitable etching gas compounds can be selected from the group consisting of fluorocarbons and hydrofluorocarbons. In addition to compounds comprising halogen and carbon, the etching gas can include other compounds for controlling particular process parameters. Such other compounds can comprise hydrocarbons, rare gases (such as, for example, helium, neon and argon), nitrogen-containing gases and/or oxygen-containing gases.

Referring still to FIG. 5, the utilization of a high density plasma in combination with the etching gas comprising both halogen and carbon causes material to be removed from the outer horizontal surfaces 27a of material 22a faster than it is removed from within gaps 28a. Specifically, a polymer 66 is deposited within gaps 28a and along sidewall peripheries 29a of the gaps to protect the material 22a within the gaps from being etched. In the shown embodiment, polymer 66 is deposited in "bread-loaf" structures 68 at upper sidewall peripheral edges of the gaps. Bread-loaf structures 68 which are adjacent to one another can grow into each other to form a cap over gap 28a which fully protects the portions of material 22a within the gaps from being etched. Alternatively, adjacent bread-loaf structures 68 may grow to constrict an upper opening of gaps 28a without fully closing such upper opening. In either event, bread-loaf structures 68 slow a rate of etching within gaps 28a relative to a rate occurring at outermost horizontal surfaces 27a. Bread-loaf structures 68 preferably substantially occlude the upper opening of gaps 28a to substantially prevent removal of material 22 from bottoms 23a of gaps 28a during the etching of material 22 from outermost surfaces 27a.

It is noted that material 22a comprises corners 70 at locations where outermost surfaces 27a join sidewall surfaces 29a, with such corners being approximately right angles. The etching process of the present invention protects sidewalls 29a during etching of upper surfaces 27a and accordingly substantially maintains the right-angle shape of corners 70. The method therefore advantageously substantially avoids faceting of corners 70. Such faceting is undesired in that it can adversely expose the conductive materials of one or more of lines 14a, 16a, 18a or 20a to the etching conditions.

The difference in rate of removal of material 22a from outermost surfaces 27a relative to the rate of removal from sidewall surfaces 29a can be controlled by several operational parameters, including, for example, a ratio of bias power to source power within the etcher. Such difference in removal rates can also be controlled by adjusting the amount and type of gases provided within the etcher. For instance, addition of one or both of a nitrogen-containing gas and an oxygen-containing gas can affect a rate of polymer formation, and accordingly affect the difference in rate of removal of material from surface 27a relative to sidewall surfaces 29a. Exemplary nitrogen-containing gases are $N_2$, $NO_x$, and $NH_3$. Exemplary oxygen-containing gases are $O_2$, $O_3$ and $CO_2$.

Figure 6:
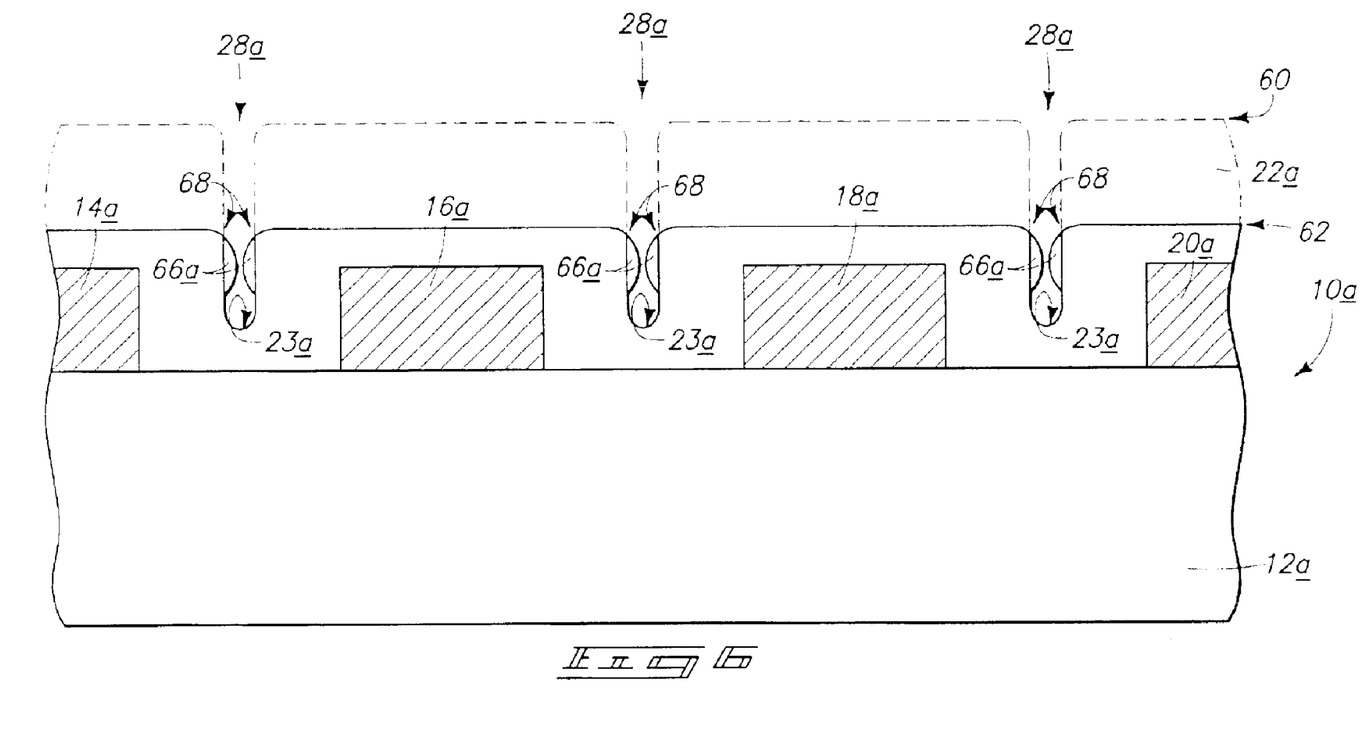
FIG. 6 is a view of the FIG. 5 substrate at a processing step subsequent to that of FIG. 5.

FIG. 6 shows fragment 10a after further etching of material 22a with the above-described high density plasma and etching gas. As shown, upper elevational level 62 of material 22a is decreased significantly relative to, the initial elevational level 60 of the material. During such etching, the width of gaps 28a remains substantially unchanged, as does an elevational level of the gap bottoms 23a.

Referring to FIG. 7, fragment 10a is illustrated after material 22a has been further etched until the upper elevational level 62 of the material is about level with the upper surfaces of conductive lines 14a, 16a, 18a and 20a. A second material 80 is then formed over conductive lines 14a, 16a, 18a and 20a, as well as over conductive material 22a. Material 80 can comprise an insulative material, and can, for example, be silicon dioxide deposited from TEOS. Material 80 has small gaps 82 over the remaining gaps 28a, with gaps 82 being substantially more shallow than were gaps 28a in the initially deposited insulative material 22a (see, for example, FIG. 5). Gaps 82 have bottom peripheries 83 above an elevational level of the uppermost surfaces of conductive lines 14a, 16a, 18a and 20a.

In the shown embodiment, polymeric material 66 is left within gaps 28a during formation of material 80. It is to be understood, however, that the invention encompasses other embodiments (not shown) wherein polymeric material 66 is removed (or partially removed) from within gaps 28a prior to formation of material 80. Methods for removing material 66 will vary depending on the nature of the polymeric material. In embodiments in which material 66 comprises an organic material, and in which material 22a is an inorganic oxide, polymeric material 66 can be removed by, for example, ashing.

Figure 8:
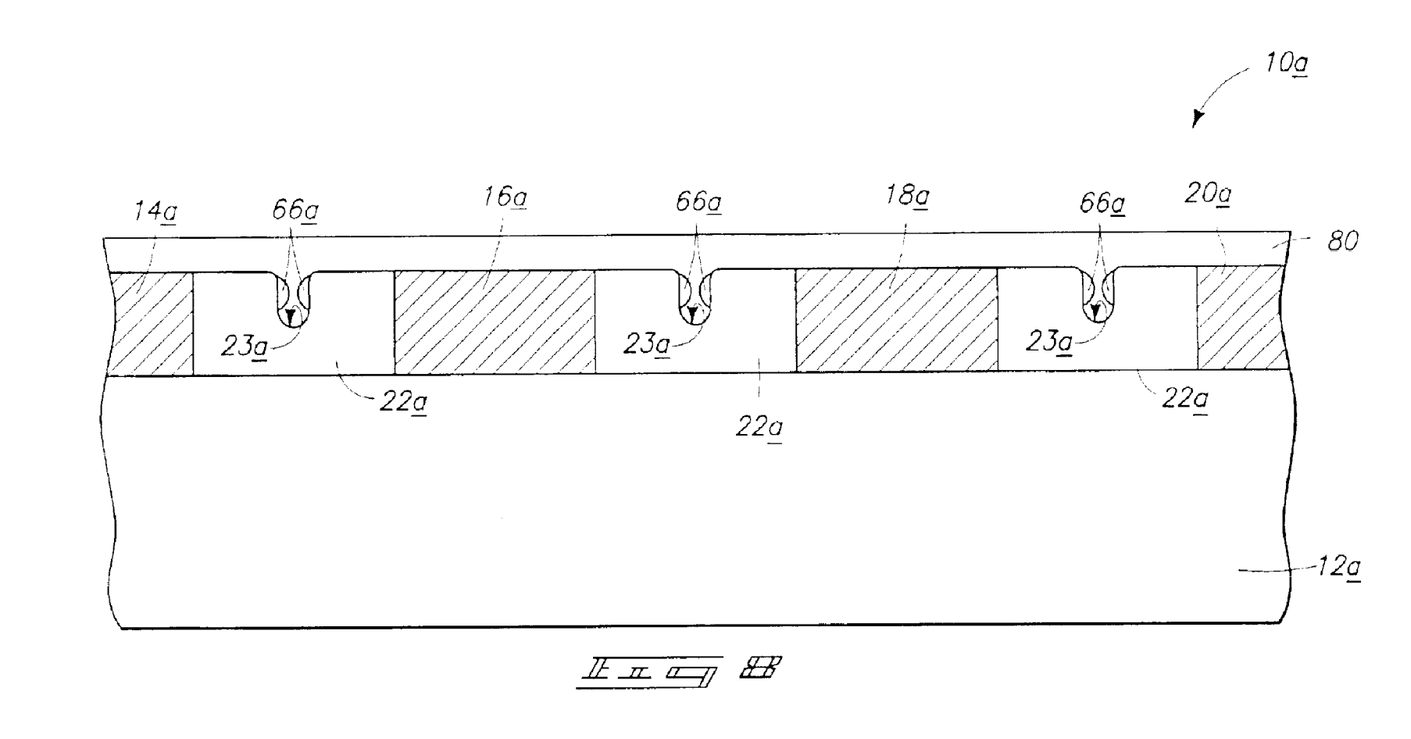
FIG. 8 is a view of the FIG. 5 substrate at a processing step subsequent to that of FIG. 7.

Referring to FIG. 8, material 80 is planarized. An exemplary method for planarizing material 80 is chemical-mechanical polishing. After planarization of material 80, conductive lines 14a, 16a, 18a and 20a are entirely surrounded by insulative material (in embodiments in which materials 22a and 80 are both insulative materials) and fragment 10a has is an outermost planar surface which can be utilized as a base for formation of additional circuitry (not shown).

Although the embodiment of FIGS. 5–8 illustrates a material 80 having relatively shallow gaps 83 which can be removed by planarization to form the planar surface of FIG. 8, in other embodiments (not shown) gaps 83 can have a relatively high aspect ratio and be difficult to simply remove by chemical-mechanical planarization. In such other embodiments, the high density plasma etching described with reference to FIG. 5 can be repeated to etch material 80. In such other embodiments, another insulative material can be provided over material 80, and said other insulative material ultimately planarized by chemical-mechanical polishing, or other mechanical processes, or can be subjected to further high density plasma etching of the type described with reference to FIG. 5.

The embodiment described with reference to FIGS. 5–8 forms a polymer which bread-loafs at an upper portion of gaps 28a (FIG. 5). Another embodiment of the invention is described with reference to FIG. 9, with the suffix "b" utilized to distinguish the materials of FIG. 9 from those of FIGS. 5–8.

FIG. 9 illustrates a fragment 10b at a processing step similar to that described above with reference to FIG. 5. Fragment 10b differs from the fragment 10a of FIG. 5 in that the polymer 66b is formed substantially conformally within gaps 28b, rather than bread-loafing at an outermost opening of gaps 28b. Polymer 66b protects sidewalls 29b in a manner similar to that by which polymer 66 protected sidewalls 29a of FIG. 5. Accordingly, fragment 10b of FIG. 9 can be processed identically to the processing described above with reference to FIG. 5 to ultimately form a structure similar to that shown in FIG. 8. It is noted that although polymer 66b covers an entirety of sidewalls 29b in the exemplary shown embodiment, the invention encompasses other embodiments wherein polymer 66b only covers a bottom portion of sidewalls 29b.

Whether it is the embodiment of FIG. 9 that is followed, or that of FIG. 5, or some merger of the two embodiments, can be determined by the parameters chosen for the high density plasma etching described with reference to FIG. 5. Specifically, variation of the etching gases and/or the ratio of bias power to source power can affect whether the etching proceeds more like that described with reference to FIG. 5, or instead like that described with reference to FIG. 9.

Figure 10:
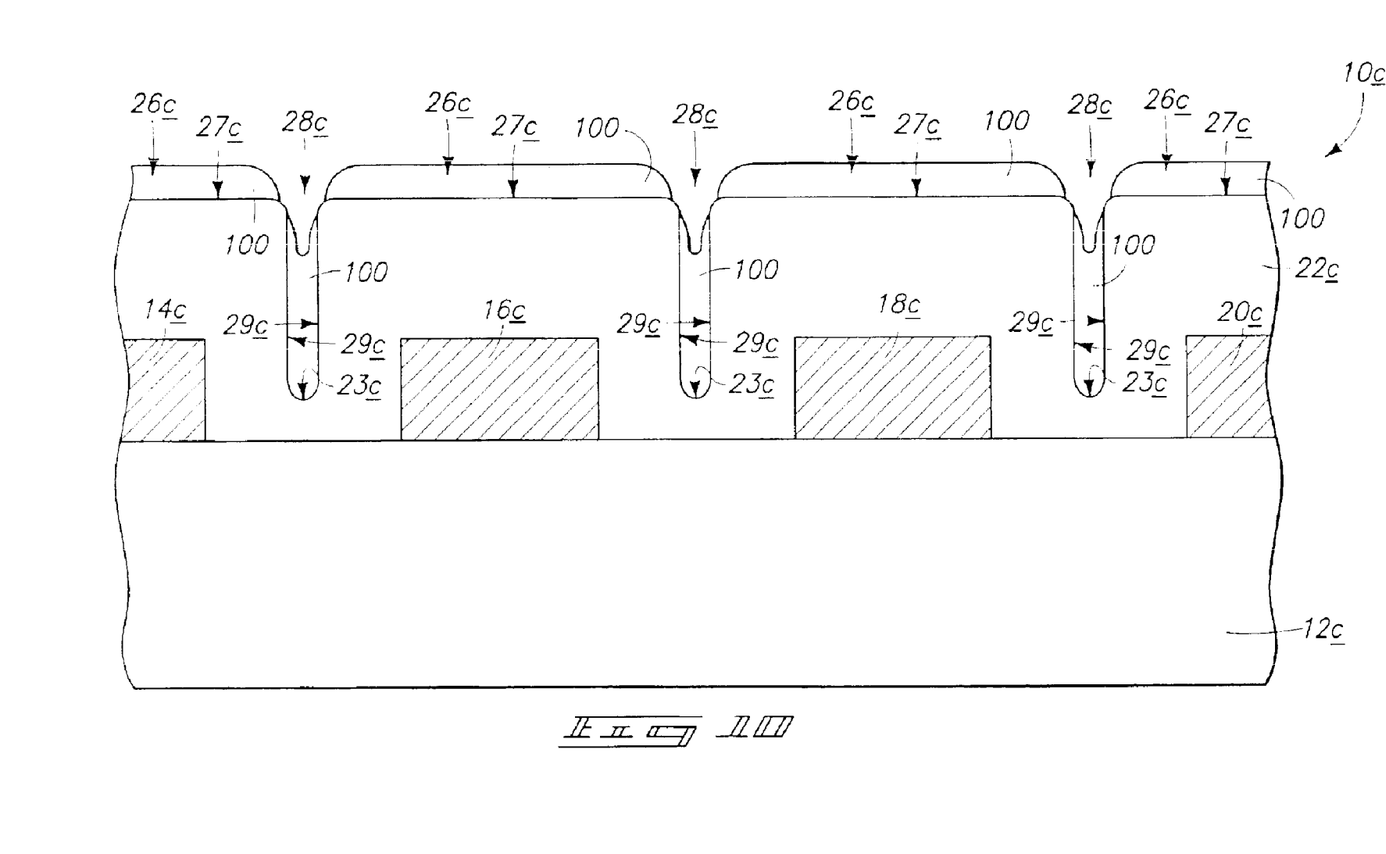
FIG. 10 is a diagrammatic, fragmentary, cross-sectional view of a substrate at a preliminary step of a third embodiment method of the present invention, with such step occurring after the prior art processing of FIG. 1.
Figure 11:
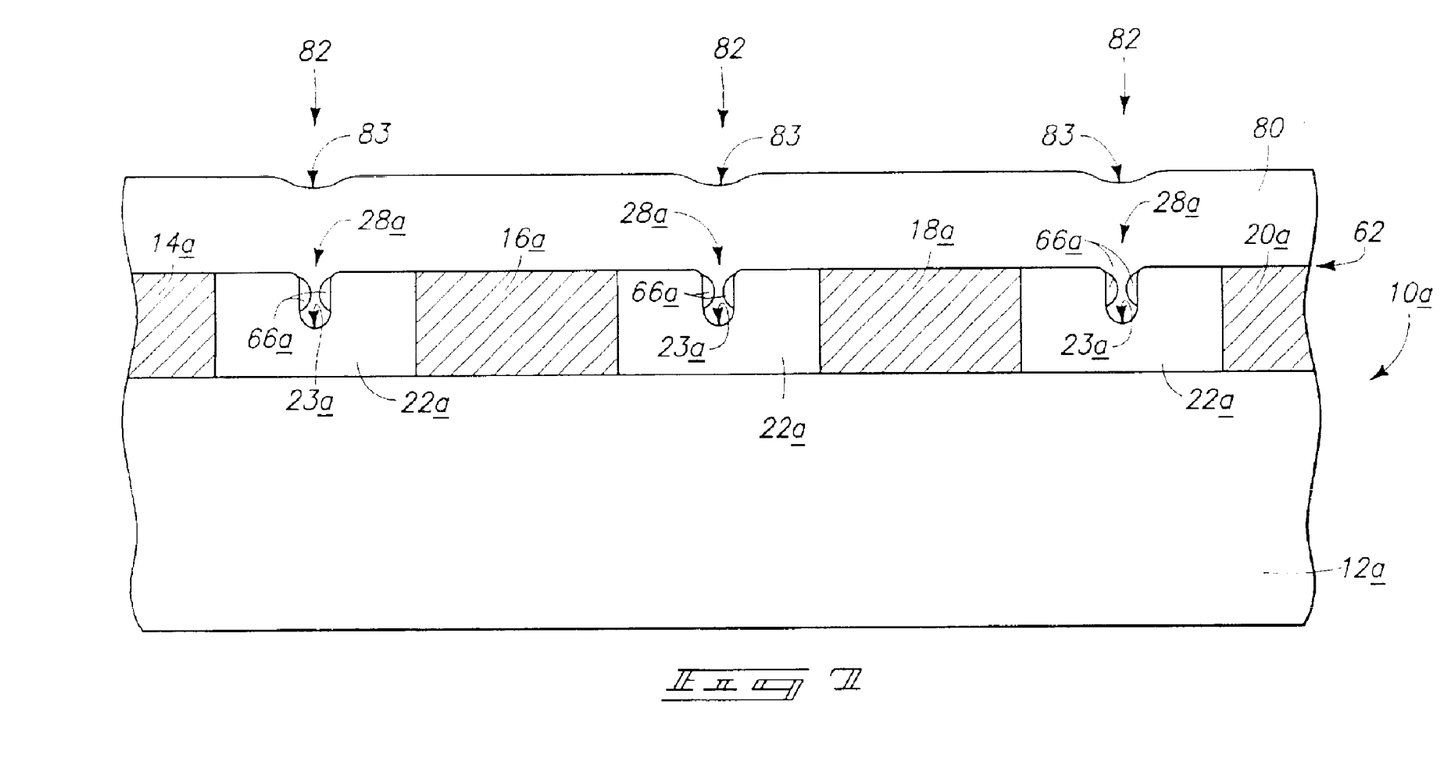
FIG. 11 is a view of the FIG. 10 substrate at a processing step subsequent to that of FIG. 10.
Figure 15:
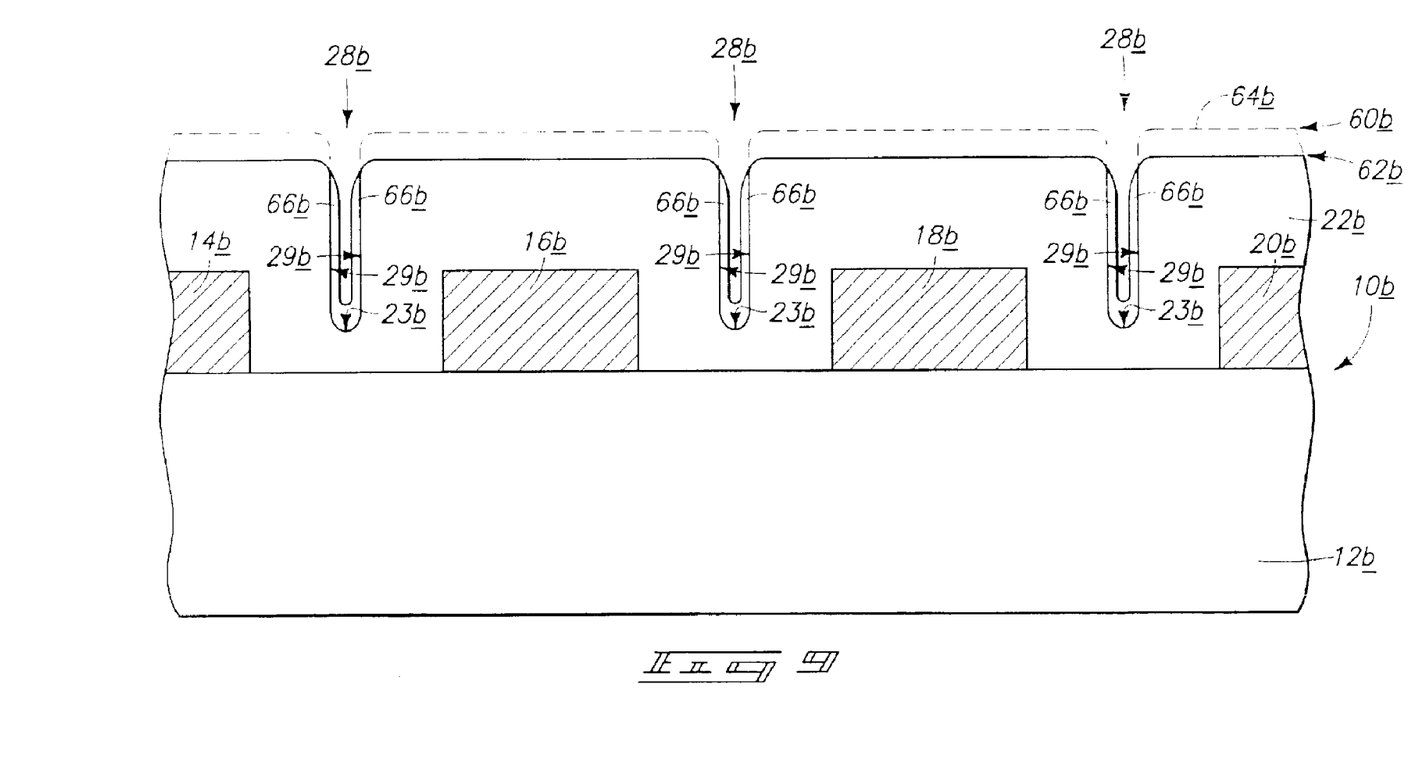

FIGS. 10–12 illustrate yet another embodiment etching method of the present invention. In referring to FIGS. 10–12, similar numbering to that utilized above in describing FIG. 5 will be used, with the suffix "c" utilized to identify structures associated with FIGS. 10–12.

FIG. 10 shows a fragment 10c comprising a substrate 12c having conductive lines 14c, 16c, 18c and 20c formed thereover. An insulative material 22c is formed over and between conductive lines 14c, 16c, 18c and 20c. Material 22c comprises outer projections 26c having horizontally extending surfaces 27c, and gaps 28c between outwardly projecting portions 26c. In contrast to the embodiment of FIG. 5, the embodiment of FIG. 10 is not shown at a stage wherein etching of material 22a has occurred. Rather, a protective material 100 is shown formed over material 22c and within gaps 28c. In the shown embodiment, material 100 is provided to a depth which does not entirely fill gaps 28c. It is to be understood, however, that the invention encompasses other embodiments (not shown) wherein material 100 does fully fill gaps 28c.

In an exemplary aspect of the invention, material 22c is an insulative material utilized as an electrical insulator between conductive lines 14c, 16c, 18c and 20c. In such aspects of the invention, material 100 can also comprise an insulative material. Material 100 can comprise, for example, polymeric materials formed by deposition from one or more of hydrocarbon precursors, fluorocarbon precursors, and hydrofluorocarbon precursors. Alternatively, material 100 can comprise photoresist. In yet other alternative embodiments, material 100 can comprise silicon dioxide formed by Flow-Fill™ processes. Flowfill™ technology has been developed by Trikon Technology of Bristol, U.K.

Referring to FIG. 11, material 100 is removed from over surfaces 27c. Such can be accomplished by, for example, chemical-mechanical polishing. After removal from over surfaces 27c, some material 100 remains within gaps 28c to protect sidewall surfaces 29c from a subsequent etch.

Referring to FIG. 12, material 22c is etched utilizing, for example, the high density plasma etch described above with reference to FIG. 5. Such removes material 22c from an initial elevational level 60c and can form polymers 66c within gaps 28c. Protective material 100 provides additional protection for sidewalls 29c during the etching process beyond that which is provided merely by the bread-loafed polymer 66c. It is noted that material 100 can comprise a composition which is etched by the high-density etching process so that material 100 is removed during removal of material 22c. If material 100 is not removed during removal of material 22c, projections of material 100 will ultimately result in the locations of gaps 28c as material 22c is removed from adjacent the material 100. Such projections can be later removed by polishing processes, such as, for example, chemical-mechanical polishing.

Fragment 10c can be processed according to methodologies similar to those described above with reference to FIGS. 5–8 to form a structure similar to that of FIG. 8.

Although the invention is described above with reference to methods of forming an insulative material over and between conductive lines, it is to be understood that the invention has general application to methods of material etching, and can be utilized for etching conductive materials. For instance, if conductive materials are formed having high aspect ratio gaps extending therein, methods of the present invention can be utilized to protect sidewalls of the gaps while the conductive material is etched. Such protection can substantially prevent the gaps from being extended during etching of the conductive material.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of forming a material over an uneven surface topology, comprising:
   providing a semiconductor substrate having the uneven surface topology, the uneven surface topology comprising a valley between a pair of outwardly projecting features;
   forming a layer of material over the uneven surface topology, the layer comprising outwardly projecting portions over the outwardly projecting features of the surface topology and having a gap over the valley; and
   etching the layer to remove an outermost surface of the layer and generally simultaneously redeposit said material within the gap.

2. The method of claim 1 wherein the material of the layer is an electrically insulative material.

3. The method of claim 1 wherein the etching comprises high density plasma etching.

4. The method of claim 1 wherein the material of the layer comprises silicon dioxide and is formed by chemical vapor deposition from TEOS.

5. The method of claim 1 wherein the etching utilizes at least one compound that includes both a halogen and carbon.

6. The method of claim 1 wherein the etching occurs in a high density plasma reactor utilizing an etching gas, a source power of from about 800 watts to about 1500 watts, a bias power of from about 500 watts to about 1600 watts, a pressure of from about 5 mTorr to about 100 mTorr, a roof temperature of from about 100° C. to about 250° C. and a ring temperature of from about 150° C. to about 350° C.

7. The method of claim 6 wherein the etching gas comprises a gas selected from the group consisting of fluorocarbons, hydrofluorocarbons, and mixtures thereof.

8. The method of claim 6 wherein the etching gas consists essentially of one or both of fluorocarbon compounds and hydrofluorocarbon compounds.

9. The method of claim 6 wherein the plasma is a high density plasma comprising at least about $1 \times 10^9$ charges/$cm^3$.

10. A semiconductor processing method of forming a material over metal-comprising lines, comprising:
   providing a first insulative material substrate;
   forming a pair of spaced metal-comprising lines over the substrate; the spaced metal-comprising lines defining an uneven surface topology which comprises the lines and a valley between the lines;
   forming a layer of second insulative material over the uneven surface topology, the layer comprising outwardly disposed portions over the metal-comprising lines and relatively recessed regions between said metal-comprising lines; and
   subjecting the layer of the second insulative material to a process which removes at least a portion of the second insulative material from said outwardly disposed portions and redeposits at least a portion of the second insulative material within said relatively recessed regions which substantially prevents the second insulative material from being removed from a bottom of said relatively recessed regions.

11. The method of claim 10 wherein the metal-comprising lines consist essentially of materials selected from the group consisting of one or more of aluminum, copper, copper alloys and aluminum alloys.

12. The method of claim 10 wherein the first and second insulative materials comprise a common composition, said common composition being either doped silicon dioxide or undoped silicon dioxide.

13. The method of claim 10 wherein the removing comprises high density plasma etching utilizing an etching gas that includes at least one compound comprising both a halogen and carbon.

14. The method of claim 13 wherein the removing occurs in a high density plasma reactor utilizing a source power of from about 800 watts to about 1500 watts, a bias power of from about 500 watts to about 1600 watts, a pressure of from about 5 mTorr to about 100 mTorr, a roof temperature of from about 100° C. to about 250° C. and a ring temperature of from about 150° C. to about 350°.

15. The method of claim 10 wherein the high density plasma comprises at least about $1 \times 10^9$ charges/$cm^3$.

16. The method of claim 10 wherein the recessed regions have respective aspect ratios of at least 1.

17. The method of claim 10 wherein the recessed regions have respective aspect ratios of at least 3.

18. The method of claim 10 wherein the recessed regions have respective aspect ratios of at least 5.

19. A semiconductor processing method of forming and etching a material, comprising:
   providing a substrate having spaced projections extending thereover;
   forming a first layer of a first insulative material over the projections, the first layer of first insulative material comprising outwardly extending portions over the projections of the substrate and openings between the projections;
   providing a first protective material within the openings to at least partially fill the openings; and
   after the providing of the first protective material, plasma etching an outermost surface of the first layer and generally simultaneously depositing a second protective material within the opening, the first and second protective materials protecting the first insulative material of the first layer from being etched from a bottom of the opening.

20. The method of claim 19 wherein the first insulative material comprises either doped or undoped silicon dioxide and is formed by chemical vapor deposition from TEOS.

21. A semiconductor processing method of forming a material over an uneven surface topology, comprising:
   providing a semiconductor substrate having the uneven surface topology, the uneven surface topology comprising a valley between a pair of outwardly projecting features;
   forming a layer of electrically insulative material over the uneven surface topology, the layer comprising outwardly projecting portions over the outwardly projecting features of the surface topology and having a gap over the valley; and
   etching the layer to remove an outermost surface of the layer and simultaneously form a polymeric material within the gap, the polymeric material substantially preventing removal of the electrically insulative material from a bottom of the gap.

22. The method of claim 21 wherein the semiconductor substrate comprises spaced conductive lines, wherein the outwardly projecting features of the uneven surface topology correspond to the lines and wherein the valley of the uneven surface topology corresponds to the space between the lines.

23. The method of claim 21 wherein the gap comprises a depth, a bottom surface, and sidewall surfaces extending along the depth to the bottom surface, and wherein the polymeric material is formed along the sidewall surfaces but not along the bottom surface.

24. The method of claim 21 wherein the gap comprises a depth, a bottom surface, and sidewall surfaces extending along the depth to the bottom surface, and wherein the polymeric material is formed along the sidewall surfaces and along the bottom surface.

25. The method of claim 21 wherein the etching comprises high density plasma etching.

26. The method of claim 21 wherein the etching utilizes a gas comprising both a halogen and carbon.

27. The method of claim 21 wherein the etching occurs in a high density plasma reactor utilizing an etching gas, a source power of from about 800 watts to about 1500 watts, a bias power of from about 500 watts to about 1600 watts, a pressure of from about 5 mTorr to about 100 mTorr, a roof temperature of from about 100° C. to about 250° C. and a ring temperature of from about 150° C. to about 350° C.

28. The method of claim 27 wherein the etching gas comprises a gas selected from the group consisting of fluorocarbons, hydrofluorocarbons, and mixtures thereof.

29. The method of claim 27 wherein the etching gas consists essentially of one or both of fluorocarbon compounds and hydrofluorocarbon compounds.

* * * * *